United States Patent [19]

Neron

[11] Patent Number: 5,666,388
[45] Date of Patent: Sep. 9, 1997

[54] CLOCK RECOVERY CIRCUIT WITH MATCHED OSCILLATORS

[75] Inventor: Christophe Neron, Nantes, France

[73] Assignee: Matra MHS, Nantes, France

[21] Appl. No.: 346,204

[22] Filed: Nov. 22, 1994

[30] Foreign Application Priority Data

Nov. 23, 1993 [FR] France ................................. 93 14000

[51] Int. Cl.⁶ ..................................................... H03D 3/24
[52] U.S. Cl. ............................. 375/376; 327/156; 331/2; 331/11; 331/18; 331/25; 455/260
[58] Field of Search ........................... 375/376; 331/1 R, 331/1 A, 2, 11, 18, 25, 34; 327/147, 148, 150, 156, 157, 159; 455/260

[56] References Cited

U.S. PATENT DOCUMENTS

| | | |
|---|---|---|
| 3,900,890 | 8/1975 | Eibner et al. . |
| 4,131,861 | 12/1978 | Malaviya . |
| 4,590,602 | 5/1986 | Wolaver . |
| 4,943,788 | 7/1990 | Laws et al. ............................. 375/376 |
| 5,184,350 | 2/1993 | Dara ...................................... 375/376 |
| 5,319,680 | 6/1994 | Port et al. ............................. 375/376 |
| 5,343,167 | 8/1994 | Masumoto et al. ................... 375/376 |

OTHER PUBLICATIONS

IEEE International Solid State Circuits Conference, vol.27, Feb. 1984, New York US—"A CMOS Ethernet Serial Interface Chip"—Haw-Ming Haung et al—pp. 184–185.

IEEE 1992 Custom Integrated Circuits Conference, vol.34, May 1992 "A BICMOS Receive/Transmit PLL Pair for Serial Data Communication" B.L. Thompson et al—pp. 29.6.1 to 29.6.5.

Patent Abstracts of Japan, vol.17, N° 359 (E1395), Jul. 1993—JP-A-05 055 914 (NEC).

GLOBECOM 1983, vol.1, Nov. 1983, San Diego, US—"Synchronization design criteria for a token ring"—H, Meyr et al—pp. 447–455.

*Primary Examiner*—Stephen Chin
*Assistant Examiner*—Don Vo
*Attorney, Agent, or Firm*—Larson & Taylor

[57] ABSTRACT

A clock recovery circuit comprises first and second voltage-controlled oscillators having identical characteristics. The first oscillator is incorporated into a frequency synthesis loop in such a way as to oscillate, in response to a first control voltage, at a frequency equal to a reference frequency multiplied by a number N. The second voltage-controlled oscillator is incorporated into a phase tracking loop which, when activated, locks its oscillation phase relative to that of the received data signal. The second oscillator delivers the recovered clock signal. A comparator determines whether the frequency of the second oscillator, divided by N, satisfies the condition of not deviating from the reference frequency by more than a predetermined limit value. The phase tracking loop is activated only when the latter condition is satisfied, and the first control voltage is fed to the control input of the second oscillator when the condition is not satisfied.

4 Claims, 3 Drawing Sheets

FIG.2.
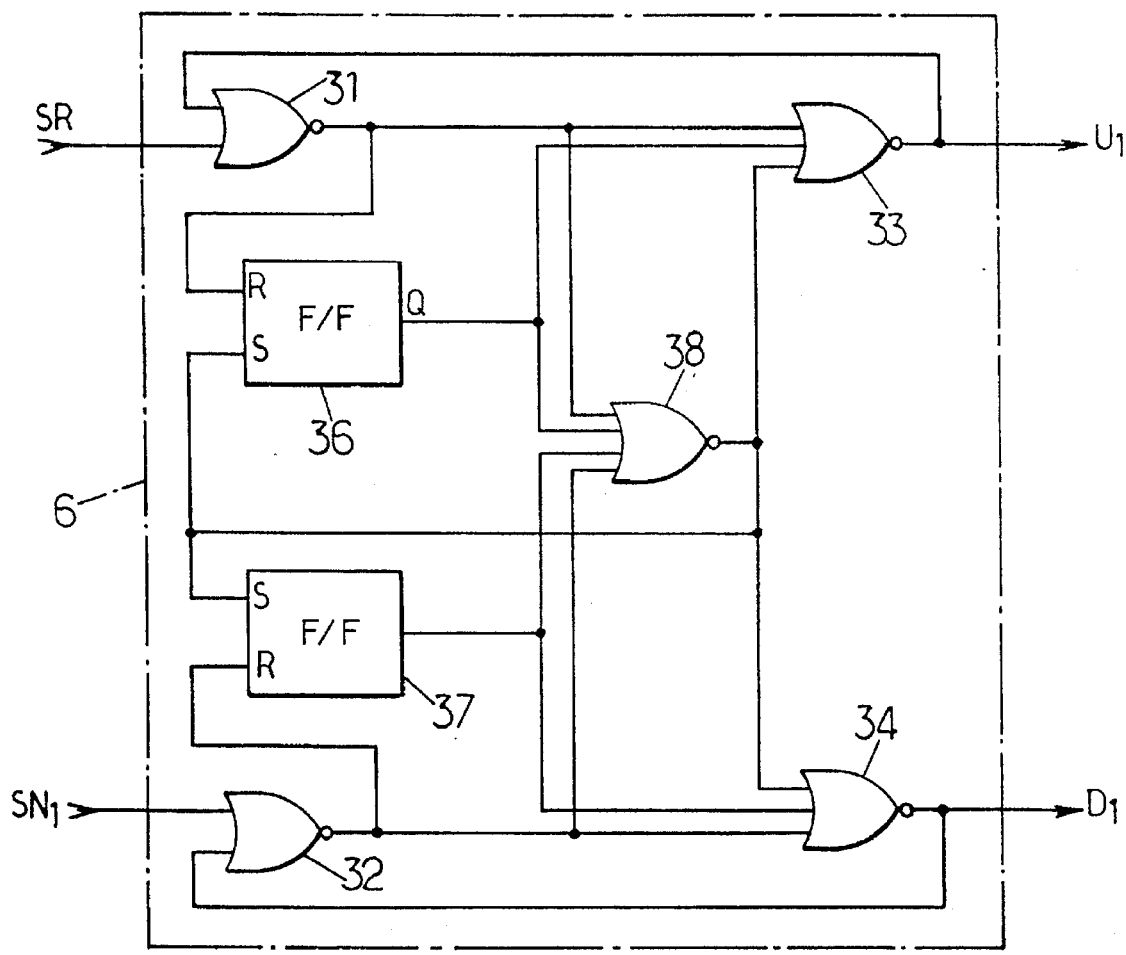
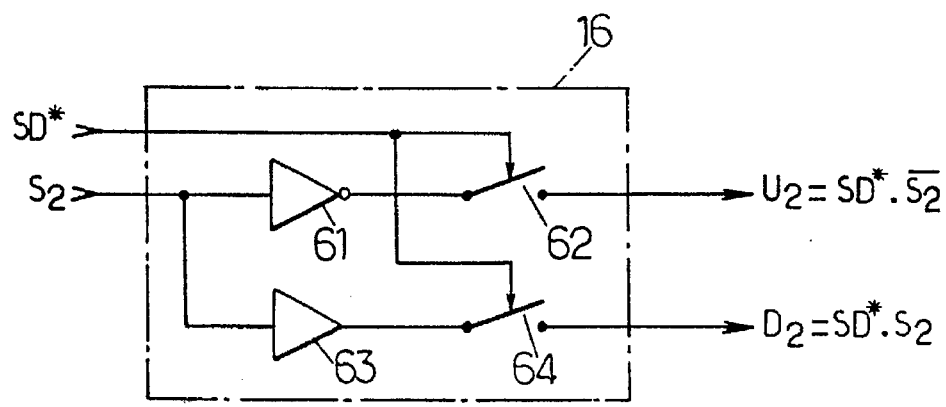
FIG.3.

CLOCK RECOVERY CIRCUIT WITH MATCHED OSCILLATORS

BACKGROUND OF THE INVENTION

The present invention relates to a clock recovery circuit for synchronizing the reception of a serial digital transmission.

For the synchronous (or even asynchronous) transmission of a serial digital data signal, the sending unit includes a generator of a serial clock signal used for coding and serializing the data. So as to synchronize correctly the decoding and deserializing of the received data, the receiving unit must also include a clock signal generator, the value of the frequency of which is a faithful image of the actual line bit-rate on the transmission channel. The clock signal generator of the receiving unit comprises a phase-locked loop (PLL) whose voltage-controlled oscillator provides a clock signal reproducing the frequency of the bit rate of the received data signal. Usually, the coding of the data is of NRZ or NRZI type, which, apart from the advantage of producing a signal having a minimum useful passband and a stable line mean value, achieves a sizeable density of transitions so as to facilitate phase-locking on reception. However, sequences may survive during which the signal received exhibits few transitions, making phase-locking on reception very difficult or even impossible. Since the pull-in range of this locking is then directly proportional to the density of transitions of the data signal received, it is seen that it is necessary for the voltage-controlled oscillator to oscillate at an initial frequency very similar to that to be extracted.

It is appreciated that it is difficult to construct a voltage-controlled oscillator having characteristics specified with a high degree of accuracy. The variations resulting from the manufacturing process and the in-service temperature variations introduce an uncertainty as regards the precise values of the characteristic parameters. On the other hand, integration techniques make it possible to construct, within the same integrated circuit, two oscillators having very similar characteristics.

This well-known principle has already been exploited in order to construct clock recovery circuits using two integrated and identical oscillators, by the master and slave technique. For example, the article "A BiCMOS Receive/Transmit PLL Pair for Serial Data Communication" by B. L. Thompson and H. S. Lee, published in Proc. of the IEEE Custom Integrated Circuits Conference, 1992, pages 29.6.1–29.6.5, describes a circuit containing matched master and slave oscillators. The master oscillator forms part of a frequency synthesis loop. Its output frequency, divided by N, is compared with a reference frequency provided by a quartz. The control voltage for the master oscillator is obtained by low-pass filtering of the signal representing the difference of the compared frequencies. The slave oscillator forms part of a phase tracking loop. The phase of its output signal is compared with that of the received data signal. The difference of the compared phases is subjected to low-pass filtering so as to provide a fine correction voltage. This fine correction voltage is superimposed on the control voltage for the master oscillator to form the control voltage for the slave oscillator. The output signal from the slave oscillator constitutes the recovered clock signal.

A drawback of the above clock recovery circuit is the fact that permanent application of the master oscillator's control voltage to the input of the slave oscillator induces phase fluctuations in the recovered clock signal. Indeed, the comparator of the frequency synthesis loop is of the "phase/frequency" type and generates, when balanced, spurious pulses (glitches) at the reference frequency of the quartz which, even if integrated by the loop filter, modulate the retrieved clock frequency. This drawback is particularly substantial for high transmission frequencies (typically greater than 100 MHz), and worsens the jitter of the recovered clock.

An object of the invention is to propose a clock recovery circuit which meets the requirements of practice better than the previously known circuits, especially in the high-frequency region.

SUMMARY OF THE INVENTION

The invention thus proposes a clock recovery circuit for synchronizing the reception of a serial data signal, comprising a first and a second voltage-controlled oscillator having substantially identical characteristics. The first voltage-controlled oscillator is incorporated into a frequency synthesis loop in such a way as to oscillate, in response to a first control voltage, at a predetermined frequency equal to a reference frequency provided by a reference oscillator multiplied by a number N. The second voltage-controlled oscillator is incorporated into a phase tracking loop which, when it is activated, locks the oscillation phase of the second voltage-controlled oscillator relative to that of the received data signal, the output signal from the second voltage-controlled oscillator constituting the recovered clock signal. The circuit further comprises comparison means for determining whether the oscillation frequency of the second voltage-controlled oscillator, divided by N, satisfies the condition of not deviating from the reference frequency by more than a predetermined limit value, and switching means controlled by the comparison means for activating the phase tracking loop only when the said condition is satisfied, and for feeding the first control voltage to the control input of the second voltage-controlled oscillator only when the said condition is not satisfied.

As long as the recovered clock frequency does not stray too far from the desired frequency, equal to N times the reference frequency, the phase tracking loop is operational so as finely to tune the phase and frequency of the recovered clock signal to those of the data signal. In the event that an appreciable deviation is detected by the comparison means, switching is effected: the second oscillator receives the first's control voltage. Since, in turn, the frequency synthesis loop is permanently locked onto the desired frequency, the switching has the effect of bringing the phase tracking loop back towards this frequency. Such a deviation giving rise to loop switching may be due to the fact that the second oscillator is not properly set up either at the start of the procedure for synchronizing reception, or immediately after a break in the transmission channel, entailing the sudden absence of the serial data signal and hence drop-out followed by drifting of the frequency of the oscillator of the tracking loop. The first case corresponds to normal initialization of the circuit which, here, is done in two stages: firstly, adjustment of the frequency while the second oscillator is receiving the first's control voltage and then, after switching, fine adjustment of the frequency and phase of the recovered clock signal under the action of the phase tracking loop. In the second case, the switching of the loops makes it possible to avoid excessive drifting of the recovered clock frequency and, when the sending of the serial data signal is again effective, the phase tracking loop can be quickly operational so as to shift back into phase with the data signal.

In the normal reception regime, the control voltage formulated by the frequency synthesis loop is not fed to the input of the second voltage-controlled oscillator. Also, when switching loops, the recovered clock frequency very quickly approaches the desired frequency, so that the first control voltage will be fed to the input of the second oscillator for a short time only. The problems of noise and additional jitter which are encountered in prior circuits as explained above are therefore eliminated in large measure.

Furthermore, when the phase tracking loop is active, it does not interact directly with the frequency synthesis loop. This minimizes the problems of crosstalk and consequently improves the performance of the circuit.

The clock recovery circuit according to the invention also has the advantages of guaranteeing that the synchronization frequency is not erroneous, especially is not a harmonic frequency of the desired frequency, of having a short acquisition time and of operating correctly independently of the temperature variations or variations resulting from the manufacturing process.

When the clock recovery circuit forms part of a sending and receiving unit, it can also generate the clock signal for sending from this unit. This signal then consists of the output signal from the voltage-controlled oscillator of the frequency synthesis loop.

BRIEF DESCRIPTION OF THE DRAWINGS

FIGS. 2 to 4 are diagrams of comparators which can be used in the circuit of FIG. 1.

DESCRIPTION OF A PREFERRED EMBODIMENT

The invention is described below in its application to bidirectional serial digital transmission. The invention does not depend on the format of the transmission (FDDI, ATM etc.) or on the mode of propagation of the data signals. It relates to the production of clock signals $CLK_1$, $CLK_2$ at high frequency ($f_C$ typically greater than 100 MHz) which clock the sending and receiving of the serial data signals.

Figure 1:
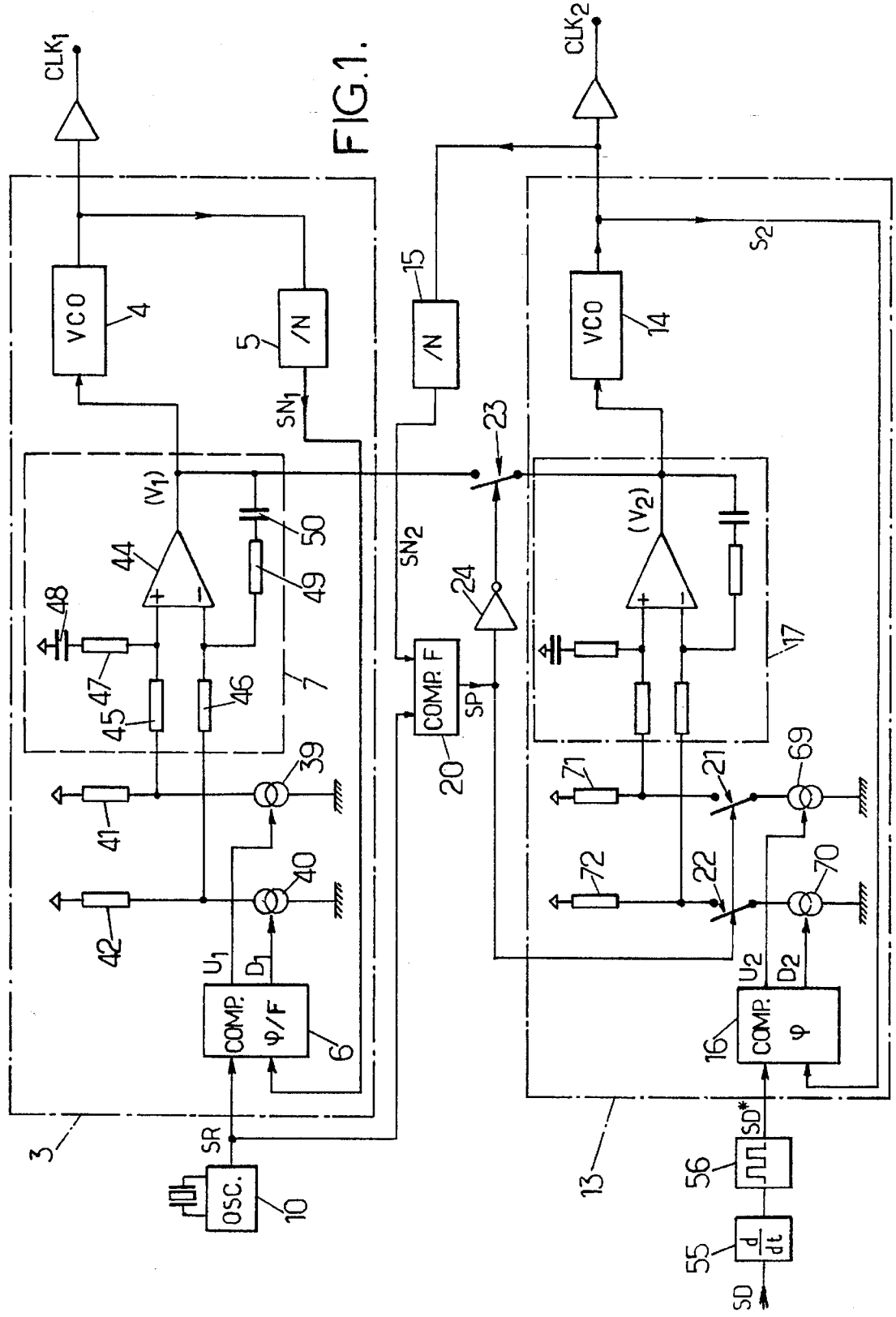
FIG. 1 is a diagram of an illustrative clock recovery circuit according to the invention.

Referring to FIG. 1, these clock signals $CLK_1$ and $CLK_2$ are delivered by a first voltage-controlled oscillator 4 and by a second voltage-controlled oscillator 14, respectively. These oscillators 4, 14 are constructed within the same integrated circuit, for example from silicon, as are the other elements of the clock recovery circuit. During manufacture of the integrated circuit, the oscillators 4, 14 are constructed in the course of the same process steps, so that they have electrical characteristics which are as alike as possible. It is appreciated that the matching of the characteristics, which is achieved in this way, may be excellent.

The first oscillator 4 is incorporated into a frequency synthesis loop 3 which further includes a circuit 5 for dividing by N, a phase and frequency comparator 6 and an integrating filter 7. The circuit 5 receives the output signal from the oscillator 4, and divides its frequency by a number N. The binary output signal $SN_1$ from the circuit 5 is fed to an input of the comparator 6. The other input of the comparator 6 receives a binary reference signal SR provided by a crystal oscillator 10. The signal SR has a well-defined reference frequency $f_R$ fixed by the crystal.

For those quartz which are commonly used, the reference frequency $f_R$ is typically of the order of 20 to 30 MHz. The value of the number N is chosen as the ratio $f_C/f_R$ between the transmission frequency and the reference frequency.

The phase and frequency comparator 6 has for example the composition shown diagrammatically in FIG. 2. It delivers two binary output signals $U_1$, $D_1$, which are representative of the frequency difference and phase difference between the signals $SN_1$, SR which are received on its two inputs. The comparator 6 includes two dual-input NOR gates 31, 32, respectively receiving the input signals SR and $SN_1$ on one of their inputs, and two triple-input NOR gates 33, 34, respectively delivering the output signals $U_1$ and $D_1$. The output of NOR gate 33 is connected to the other input of NOR gate 31, and the output of NOR gate 31 is connected to an input of NOR gate 33. The output of NOR gate 34 is connected to the other input of NOR gate 32, and the output of NOR gate 32 is connected to an input of NOR gate 34. The comparator 6 also includes two RS-type flip-flops 36, 37, whose R inputs are connected respectively to the outputs of NOR gates 31, 32. The Q output of the RS flip-flop 36 is connected on the one hand to another input of NOR gate 33, and on the other hand to an input of a four-input NOR gate 38. The Q output of the RS flip-flop 37 is connected on the one hand to another input of NOR gate 34, and on the other hand to another input of NOR gate 38. The other two inputs of NOR gate 38 are connected respectively to the outputs of NOR gates 31 and 32. The output of NOR gate 38 is connected to the third input of NOR gate 33, to the third input of NOR gate 34, and to the S inputs of the RS flip-flops 36, 37. The comparator 6 is sensitive to the rising edges of the input signals SR and $SN_1$, and the outputs $U_1$ and $D_1$ are active in the high state. If the signal SR has a larger frequency than that of the signal $SN_1$, only the output $U_1$ is active, the output $D_1$ remaining permanently at 0. In this case, $U_1$ is set high on a rising edge of SR and reset low on a rising edge of $SN_1$. In the contrary case, since the circuit is symmetric, only the output $D_1$ is active. When the two input signals SR and $SN_1$ are at the same frequency and in phase, the two output signals $U_1$ and $D_1$ are inactive in the low state.

As FIG. 1 shows, the output signals $U_1$, $D_1$ from the comparator 6 are used to control current generators 39, 40. In the case where the gain of the oscillator 4 is for example negative, the generator 39 is mounted in series with a resistor 41 between positive and negative supply terminals of the circuit, and conducts a specified current when $U_1$ is active, such as to reduce the voltage on the positive input of the integrating filter 7, in order to increase the frequency of the binary signal $SN_1$ when $U_1=1$. Similarly, the generator 40 is mounted in series with a resistor 42 between the supply terminals, and conducts the same current when $D_1$ is active, such as to reduce the voltage on the negative input of the integrating filter 7 in order to decrease the frequency of the binary signal $SN_1$ when $D_1=1$.

The composition of the integrating filter 7 is illustrated in FIG. 1. It includes a differential amplifier 44 whose positive input is connected to the output of the generator 39 by way of a load resistor 45, and whose negative input is connected to the output of the generator 40 by way of a load resistor 46 of the same ohmic value as the resistor 45. The positive input of the amplifier 44 is also connected to the positive supply terminal by way of a resistor 47 and a capacitor 48 which are mounted in series. The output of the amplifier 44, which delivers the control voltage $V_1$ for the oscillator 4, is connected to its negative input by way of a feedback resistor 49 and a feedback capacitor 50, which have the same characteristics as the resistor 47 and the capacitor 48 respectively.

Thus, the frequency synthesis loop 3 produces a send clock signal $CLK_1$ whose frequency $f_C$ is stable, and equal to N times the reference frequency $f_R$.

The second oscillator 14 is incorporated into a phase tracking loop 13 which furthermore includes a phase comparator 16, and an integrating filter 17. The comparator 16 has two inputs which respectively receive the binary output signal $S_2$ from the oscillator 14, and a signal $SD^*$ obtained by preprocessing the data signal SD received by the circuit. In the example represented, the data signal SD is in the NRZ format, and is preprocessed by means of a differentiator 55 and a rectifier 56, so that the signal $SD^*$ fed to the input of the comparator 16 contains a positive voltage pulse with each rising or falling edge of the signal SD.

A basic diagram of the phase comparator 16 is represented in FIG. 3. It includes an inverting gate 61 whose input receives the output signal $S_2$ from the oscillator 14, and whose output is connected to a terminal of a switch 62. The other terminal of the switch 62 provides an output signal $U_2$ from the comparator. The comparator 16 also includes a non-inverting gate 63 whose input receives the output signal $s_2$ from the oscillator 14, and whose output is connected to a terminal of a switch 64. The other terminal of the switch 64 provides an output signal $D_2$ from the comparator. The switches 62 and 64 are controlled by the data signal $SD^*$, in such a way as to be closed only when $SD^*=1$. Thus, the output signal $U_2$ is in logic state 1 only when $S_2=0$ and $SD^*=1$, and the output signal $D_2$ is in logic state 1 only when $S_2=SD^*=1$. The phase discrepancy between $S_2$ and $SD^*$ is proportional to the difference of duty ratio between $U_2$ and $D_2$.

The integrating filter 17 of the phase tracking loop 13 is identical to that 7 of the frequency synthesis loop 3, and it exhibits the same characteristics. The load circuit of the filter 17 (current generator 69 controlled by the output signal $U_2$ from the comparator 16 and associated with a resistor 71; current generator 70 controlled by the output signal $D_2$ from the comparator 16 and associated with a resistor 72) is also identical to that of the integrating filter 7 of the other loop (generators 39, 40 and resistors 41, 42). However, two switches 21, 22 are present upstream of the filter 17. The switch 21 is interposed between the current generator 69 and the load resistor of the positive input of the differential amplifier of the filter 17. The switch 22 is interposed between the current generator 70 and the load resistor of the negative input of the differential amplifier of the filter 17.

The switches 21, 22 are controlled by a binary selection signal SP, in such a way as to be closed when SP=1, and open when SP=0. The output of the integrating filter 17, which is at a voltage $V_2$, is connected to the control input of the oscillator 14. A switch 23 is also mounted between the respective outputs of the integrating filters 7 and 17. This switch 23 is controlled by the logical complement of the signal SP, provided by an invertor 24.

Thus, when SP=1, the phase tracking loop 13 is activated (switches 21 and 22 closed), and the outputs of the two integrating filters 7, 17 are isolated from one another (switch 23 open). Conversely, when SP=0, the phase tracking loop 13 is deactivated (switches 21 and 22 open), and the control voltage $V_1$ provided by the integrating filter 7 of the frequency synthesis loop is fed to the control input of the oscillator 14 (switch 23 closed).

The output signal from the second oscillator 14 is also fed to the input of another circuit 15 for dividing by N which has a composition identical to that of the circuit 5. The output signal from the circuit 15 is fed to an input of a frequency comparator 20. The other input of the comparator 20 is connected to the reference oscillator 10 so as to receive the reference signal SR. The comparator 20 determines the frequency discrepancy between the signals received on its two inputs. If this discrepancy, in absolute value, exceeds a predetermined threshold $f_S$, the comparator 20 sets the selection signal SP into the state SP=0 so that the switch 23 feeds the voltage $V_1$ to the control input of the second oscillator 14. On the other hand, if the discrepancy remains less than the threshold $f_S$, the comparator 20 sets the selection signal SP into the state SP=1 so as to activate the phase tracking loop 13.

Thus, when the frequency of the clock signal $CLK_2$ is between $N(f_R-f_S)$ and $N(f_R+f_S)$, the phase tracking loop 13 is operational ($V_2$ controls the oscillator 14). And when the frequency of the signal $CLK_2$ deviates by at least $Nf_S$ from the desired frequency $Nf_R$, the control voltage $V_1$ forces the oscillator 14 to return to the desired frequency. The oscillator 14 is thus guaranteed to remain at the proper frequency whilst also minimizing the interactions between the two loops 3, 13.

The value of the frequency threshold $f_S$ is mainly dependent on the dynamic characteristics (pull-in range) of the phase tracking loop 13. The maximum tolerable discrepancy between $f_R$ and $f_S$ ($[f_R-f_S]$ in absolute value) must in all circumstances remain less than or equal to the minimum possible pull-in range of the phase locking 13. This discrepancy can be very small and is typically of the order of a few percent of the reference frequency $f_R$.

The capacitors of the loop filter 17 play a storage role during transitions of the signal SP from the 0 state to the 1 state. Indeed, when SP=0, the two integrating filters are polarized identically at their inputs ($U_1=D_1=0$ and the switches 21 and 22 are open) and at their outputs (the switch 23 is closed and hence $V_1=V_2$) so as to ensure that the integrator capacitors of the filter 17 charge up to the same value as those of the filter 7. The phase tracking loop 13 is thus correctly set up frequency-wise at the instant of its activation.

The oscillators 4, 14, and the circuits for dividing by N 5, 15 are conventional digital counting subcircuits. Their composition can for example by such as described in the article "A BiCMOS Receive/Transmit PLL Pair for Serial Data Communication" cited in the introduction.

Since the frequency comparator 20 essentially performs low-frequency pulse counting (at the reference frequency), it may readily be constructed using CMOS technology (complementary metal-oxide-semiconductor) and thus not substantially increase the static consumption of the circuit as a whole.

Figure 4:
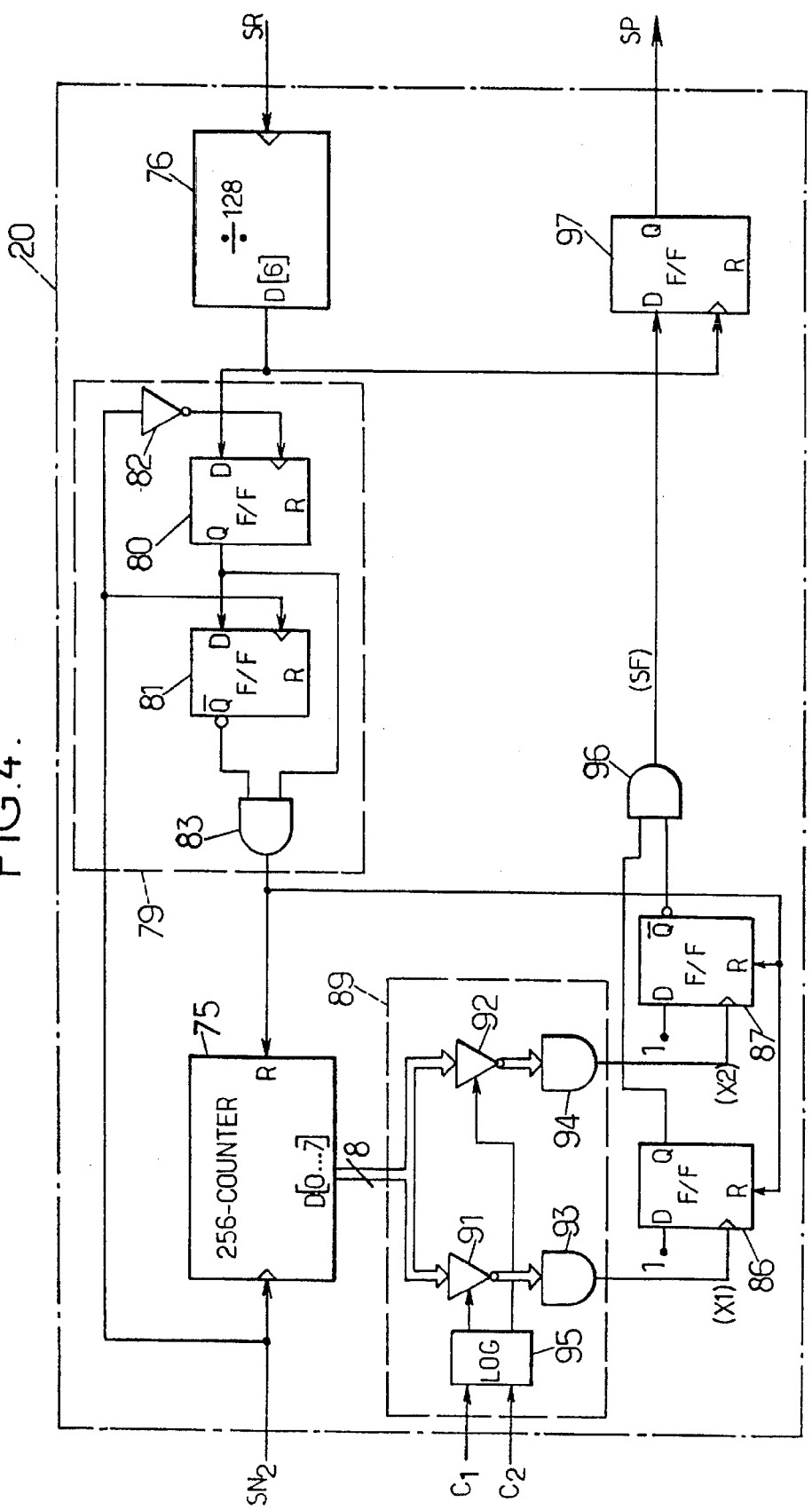

The composition of the comparator 20 may be such as illustrated in FIG. 4. This comparator 20 comprises an eight-bit counter 75 which counts the pulses (rising edges) of the output signal $SN_2$ from the divide by N circuit 15 and a seven-bit counter 76 which counts the pulses (rising edges) of the reference signal SR. The counter 76 operates as a divider by 128: only its most significant bit D[6] is extracted as output signal from the counter. The digital layout in the counter 76 is such that this bit D[6] passes from 0 to 1 with each overflow of the counter. The output signal from the counter 76 is fed to a combinatorial logic element 79 which comprises two D-type flip-flops 80, 81, an invertor 82, and a dual-input AND gate 83. The D input of the flip-flop 80 is connected to the output of the counter 76, and its clock input receives the signal $SN_2$ via the invertor 82. The Q output of the flip-flop 80 is fed on the one hand to the D input of the other flip-flop 81, and on the other hand to an input of the AND gate 83. The clock input of the flip-flop 81 receives the signal $SN_2$. The inverted Q output from the flip-flop 81 is fed to the other input of the AND gate 83. In this way, the combinatorial logic element 79 provides a pulse of logic level 1 at the output of the AND gate 83 with each overflow of the counter 76. The frequency of these pulses is therefore equal to the reference frequency $f_R$ divided by 128, and their duration is equal to a half-period of the signal $SN_2$.

The output of the AND gate 83 is connected on the one hand to a reset input of the counter 75, and on the other hand to the respective reset inputs of two D-type flip-flops 86, 87. The eight-bit output from the counter 75 is fed to a state decoder 89, which delivers two state signals $X_1$, $X_2$ fed respectively to the clock inputs of the D flip-flops 86, 87. The decoder 89 is an arrangement of logic gates which is such that the state signal $X_1$ is at logic level 1 when the eight-bit output from the counter 75 represents the number 127–k and in logic state 0 otherwise, and that the state signal $X_2$ is in logic state 1 when the eight-bit output from the counter 75 represents the number 127+k and in logic state 0 otherwise. The decoder 89 comprises two assemblies 91, 92 of eight logic gates each, each gate operating on one of the bits of the output from the counter 75. The assembly 91 comprises an inverting gate for each bit equal to 0 when the output from the counter 75 is equal to 127–k, and a non-inverting gate for the other bits. Similarly, the assembly 92 comprises an inverting gate for each bit equal to 0 when the output from the counter 75 is equal to 127+k, and a non-inverting gate for the other bits. The eight output bits from the assembly 91 are fed respectively to the eight inputs of an AND gate 93 whose output delivers the signal $X_1$. The eight output bits from assembly 92 are fed respectively to the eight inputs of an AND gate 94 whose output delivers the signal $X_2$. A programming logic element 95 is associated with the assemblies 91, 92 to allow selection of the bits to be inverted. This makes it possible to choose the value of the number k. In the example represented, the programming logic element 95 receives two binary control signals $C_1$, $C_2$, this making it possible to choose the number k from four values, for example k=1, 2, 3 or 4.

The D inputs of the flip-flops 86 and 87 are maintained permanently in logic state 1. The two inputs of an AND gate 96 respectively receive the Q output from the D flip-flop 86 and the inverted Q output from the D flip-flop 87. The output SF from the AND gate 87 is fed to the D input of a D-type flip-flop 97. The clock input of this D flip-flop 97 is connected to the output of the counter 76. Its Q output delivers the selection signal SP.

With the comparator 20 described above, the output signal SF from the AND gate 96 is equal to 1 in the time interval between the moment at which the output from the counter 75 becomes equal to 127–k and the moment at which this output becomes equal to 127+k, and 0 outside of this interval. If overflow of the counter 76 occurs during this interval (that is to say if the frequency discrepancy between the signals $SN_2$ and SR is less than the threshold $f_S$), the output SP from the D flip-flop 97 is latched in the 1 state. On the other hand, if overflow of the counter 76 occurs outside of the interval in which SF=1, the selection signal SP is latched to the 0 state.

The value of the frequency discrepancy threshold $f_S$ is determined by the value of the number k selected by the programming logic element 95 as a function of the commands $C_1$, $C_2$, and by the number of bits n of the counter 75 (it being noted that the counter 76 will generally have one less bit than the counter 75): $f_S=f_R \times k/2^{n-1}$. The values indicated in the above example (n=8, k=1, 2, 3 or 4) therefore allow $f_S$ to be selected from the values $0.0078 \times f_R$, $0.0156 \times f_R$, $0.0234 \times f_R$ and $0.312 \times f_R$.

I claim:

1. Clock recovery circuit for synchronizing the reception of a serial data signal, comprising first and second voltage-controlled oscillators having substantially identical characteristics, wherein the first. voltage-controlled oscillator is incorporated into a frequency synthesis loop in such a way as to oscillate, in response to a first control voltage, at a predetermined frequency equal to a reference frequency provided by a reference oscillator multiplied by a number N, and the second voltage-controlled oscillator is incorporated into a phase tracking loop which, when it is activated, locks the oscillation phase of the second voltage-controlled oscillator relative to that of the received data signal, the output signal from the second voltage-controlled oscillator constituting a recovered clock signal, the clock recovery circuit further comprising comparison means for determining whether the oscillation frequency of the second voltage-controlled oscillator, divided by N, satisfies the condition of not deviating from the reference frequency by more than a predetermined limit value, and switching means controlled by the comparison means for activating the phase tracking loop only when said condition is satisfied, and for feeding the first control voltage to a control input of the second voltage-controlled oscillator only when said condition is not satisfied.

2. Clock recovery circuit according to claim 1, wherein the frequency synthesis loop includes a first integrating filter having an output connected to a control input of the first voltage-controlled oscillator, wherein the phase tracking loop includes a second integrating filter having an output connected to the control input of the second voltage-controlled oscillator, wherein the first and second integrating filters have substantially identical characteristics, and wherein the switching means comprise on the one hand at least one switch included within the phase tracking loop upstream of the second integrating filter, which is closed only when said condition is satisfied, and on the other hand a switch situated between the respective outputs of the first and second integrating filters, which is closed only when said condition is not satisfied.

3. Clock recovery circuit according to claim 1, wherein the first and second voltage-controlled oscillators are embodied within the same integrated circuit.

4. Clock recovery circuit according to claim 1, serving also to generate a clock signal for sending another serial data signal, wherein the send clock signal consists of the output signal from the first voltage-controlled oscillator.

* * * * *